United States Patent [19]

Negahban et al.

[11] Patent Number: 5,661,483
[45] Date of Patent: Aug. 26, 1997

[54] AREA INTEGRATOR SERVO DEMODULATOR WITH ON-CHIP CMOS ANALOG-TO-DIGITAL CONVERTER

[75] Inventors: Mehrdad Negahban; Habib Abouhossein, both of Irvine, Calif.

[73] Assignee: Western Digital Corporation, Irvine, Calif.

[21] Appl. No.: 609,266

[22] Filed: Feb. 29, 1996

[51] Int. Cl.$^6$ .................................................. H03M 1/38
[52] U.S. Cl. ........................ 341/161; 341/163; 341/156
[58] Field of Search ................................. 341/161, 162, 341/163, 145, 155, 156

[56] References Cited

U.S. PATENT DOCUMENTS

| 4,311,988 | 1/1982 | Kelley et al. | 340/347 |
| 4,598,269 | 7/1986 | Penney | 340/347 |
| 4,649,371 | 3/1987 | Kolluri | 340/347 |
| 5,489,904 | 2/1996 | Hadidi | 341/156 |

*Primary Examiner*—Jeffrey A. Gaffin
*Assistant Examiner*—Jason H. Vick
*Attorney, Agent, or Firm*—Leo J. Young

[57] ABSTRACT

An integrated circuit for a disk drive that includes a sucessive-approximation analog-to-digital converter (ADC) with a two-stage digital-to-analog converter (DAC) and may also include a servo demodulator. The circuit may be implemented in a basic or pure-digital CMOS chip because the ADC includes no precision analog elements such as resistors and capacitors. The first DAC stage operates on the most significant group of bits, and the second DAC stage operates on the least significant group of bits. The DAC includes a reference current source. The first DAC stage is a multiplying DAC that multiplies the reference current in response to its digital input, and the second stage is a dividing DAC that divides the reference current in response to its input. The DAC also includes a current summer, such as a resistor, that receives the output current of each stage and provides the voltage that corresponds to the sum of the currents to a comparator. The comparator output controls a successive-approximation register. The circuit of this invention is suitable for use in implementing an Area Integrating Servo Demodulator (AISD) for detecting head position information in a disk drive servo signal without precision analog components.

22 Claims, 3 Drawing Sheets

AREA INTEGRATOR SERVO DEMODULATOR WITH ON-CHIP CMOS ANALOG-TO-DIGITAL CONVERTER

BACKGROUND OF THE INVENTION

1. Field of the Invention

This invention relates generally to analog-to-digital converters and to disk drives for computers and, more specifically, to an integrated circuit for analog-to-digital conversion of servo signals in a disk drive.

2. Description of the Related Art

An analog-to-digital converter (ADC) is a circuit that receives a voltage or current input and, in response, produces a digital output that corresponds to the input. An ADC typically includes a digital-to-analog converter (DAC), which is a circuit that receives a digital input and, in response, produces a voltage or current that corresponds to the input.

Several types of ADCs are known in the art. The simplest type of ADC is known as a single-slope or ramping ADC. A ramping ADC includes a counter, a DAC and a comparator. The DAC receives the output of the counter. The comparator receives the input voltage and the output of the DAC. The counter begins counting upwards from a value of zero and stops when the comparator indicates that the voltage corresponding to the count equals the input voltage. The count at which that condition occurs is the digital output that corresponds to the input voltage. Another type of ADC, known as a tracking ADC, is similar to a ramping ADC, but the counter counts either upwards or downwards, thereby tracking changes in the input voltage.

Another type of ADC is known as a successive-approximation ADC. A successive-approximation ADC includes a DAC, a comparator, and a successive approximation register (SAR). The comparator receives the input voltage and the output of the DAC. The DAC receives the output of the SAR. On the first cycle of the conversion, the SAR begins by producing a digital output that is one-half the full-scale value. On the second cycle the SAR produces an output that is halfway between its previous output and zero if the comparator indicates that the input voltage is less than the output of the DAC, and produces an output that is halfway between its previous output and the full-scale value if the comparator indicates that the input voltage is greater than the output of the DAC. On successive cycles, the SAR continues to produce outputs halfway between two previous outputs or between a previous output and zero or between a previous output and the full-scale value. A successive approximation ADC thus performs a binary search until it arrives at a digital output that corresponds most closely to the analog input. Successive approximation ADCs therefore have faster average conversion times than ramping ADCs.

Several types of DACs are known in the art. The simplest type of DAC is known as a weighted-resistor DAC because it includes a network of resistors connected to a summing node. The bits of the input word are connected to corresponding switches, such as transistors. Each switch connects one of the resistors into the network if the corresponding bit is high ("1") and disconnects the resistor from the network if the corresponding bit is low ("0"). The resistor has a value that is weighted according to the position of the bit. The summing node sums the currents contributed by the resistors that are switched into the network, thereby producing a current that corresponds to the digital input. An op-amp is typically included to convert this current into a voltage output. A modified type of weighted-resistor DAC, known as a R-2R ladder DAC, has a resistor network that minimizes the range of resistor values. Similar types of DACs are known that use a capacitor network rather than a resistor network. A related type of DAC, known as a binary-weighted current sink DAC, includes weighted current sources rather than weighted resistors. Each bit controls a group of transistors, such as bipolar transistors or metal-oxide semiconductor field-effect transistors (MOSFETs), corresponding in number to the weight of the bit. The number of transistors in the group controlled by the $n^{th}$ bit is $2^n$. The gates of the MOSFETs in each group are coupled to each other and to the controlling bit. The sources and drains of the MOSFETs in each group are also coupled to each other. An N-bit binary-weighted current sink DAC thus requires $2^N-1$ transistors.

A DAC is typically implemented in an integrated circuit or chip. The precision of the resistors and the offset voltage of the transistors of a DAC affect its accuracy. Current sink DACs are preferred because they minimize the number of resistors and thus the cumulative error. Current sink DACs can be implemented using common chip fabrication processes such as the bipolar metal-oxide semiconductor (BiMOS), complementary metal-oxide semiconductor (CMOS), and bipolar complementary metal-oxide semiconductor (BiCMOS) process. CMOS and BiCMOS chips are advantageous because they are more power-efficient than many other processes. Nevertheless, it is difficult and thus relatively uneconomical to produce precision resisters using the CMOS and BiCMOS processes.

The servo system of a computer disk drive includes a servo demodulator and an ADC. The servo system receives servo burst signals from certain transducer heads and uses those signals to determine the radial position of the heads on the disk. The disk drive microprocessor can determine the position of the heads in response to the integral of the servo burst over a certain time period. The ADC, which is typically eight to 10 bits wide, converts the integral to a digital value and provides it to the microprocessor. In certain servo systems, the servo demodulator estimates this integral by full-wave rectifying the servo burst, detecting the peaks, and estimating the integral based on an assumption that the waveform is known. In other servo systems, the servo demodulator determines the integral by full-wave rectifying the servo burst and providing the rectified signal to an analog integrator circuit. The latter type of servo demodulator is more accurate and is known as an area integrating servo demodulator (AISD). The AISD is conventionally implemented with analog components in a BiCMOS integrated circuit or chip. Commercially available BiCMOS servo chips that form the basis for an AISD include, for example, the Analog Devices AD7775.

It would be desirable to provide an ADC that is economical, accurate and power-efficient. It would further be desirable to provide an ADC that interfaces with the AISD in an economical manner and suitable for integration onto the same microcircuit chip. These problems and deficiencies are clearly felt in the art and are solved by this invention in the manner described below.

SUMMARY OF THE INVENTION

This invention is a circuit that includes a successive-approximation analog-to-digital converter (ADC) having a two-stage digital-to-analog converter (DAC). The ADC can be coupled to another circuit to convert an analog input signal to a digital output signal. The circuit of this invention may be implemented without precision analog components in a pure-digital or basic complementary metal-oxide semiconductor (CMOS) chip, defined herein as a CMOS chip that does not require analog CMOS fabrication processes because the chip includes no precision analog elements such as resistors and capacitors, thereby reducing fabrication cost. Such a chip may be used in a disk drive to digitize the demodulated servo signals. For instance, the circuit of this invention is suitable for use in implementing an Area Integrating Servo Demodulator (AISD) for detecting head position information in a disk drive servo signal without precision analog components.

The ADC includes a multiplying current DAC stage, a dividing current DAC stage, a comparator and a N-bit successive-approximation register. The multiplying current DAC stage operates on the most significant group of bits produced by the successive-approximation register, and the dividing current DAC stage operates on the least significant group of bits produced by the successive-approximation register. The DAC includes a reference current source. The multiplying current DAC stage multiplies the reference current in response to its digital input, and the dividing current DAC stage divides the reference current in response to its digital input. The DAC also includes a current summer, such as a resistor, that receives the output current of each stage and provides the voltage that corresponds to the sum of the currents to a comparator. The comparator output controls the successive-approximation register.

The chip is economical to manufacture because it does not require analog CMOS processes. The analog-to-digital conversion is very accurate because the DAC uses fewer transistors than a conventional DAC, thereby minimizing the potential cumulative error. Furthermore, the analog-to-digital conversion is fast because it uses current switching as the basic technique. The range of current transitions is minimized by multiplying the reference current upward in the first DAC stage and dividing it downward in the second DAC stage. Moreover, because the novel DAC structure enables the chip to be implemented in basic CMOS, the chip may include a servo demodulator. Integrating the ADC and servo demodulator on the same CMOS chip is economical because it minimizes the number of separate component parts in a disk drive. Integrating the ADC and servo demodulator on the same chip also reduces servo error because it facilitates forming matched components in the ADC and the servo demodulator and allows the ADC and servo demodulator to receive identical reference voltages.

The foregoing, together with other features and advantages of this invention, will become more apparent when referring to the following specification, claims, and accompanying drawings.

BRIEF DESCRIPTION OF THE DRAWING

For a more complete understanding of this invention, reference is now made to the following detailed description of the embodiments illustrated in the accompanying drawing, wherein.

DETAILED DESCRIPTION OF THE PREFERRED EMBODIMENTS

Figure 1:
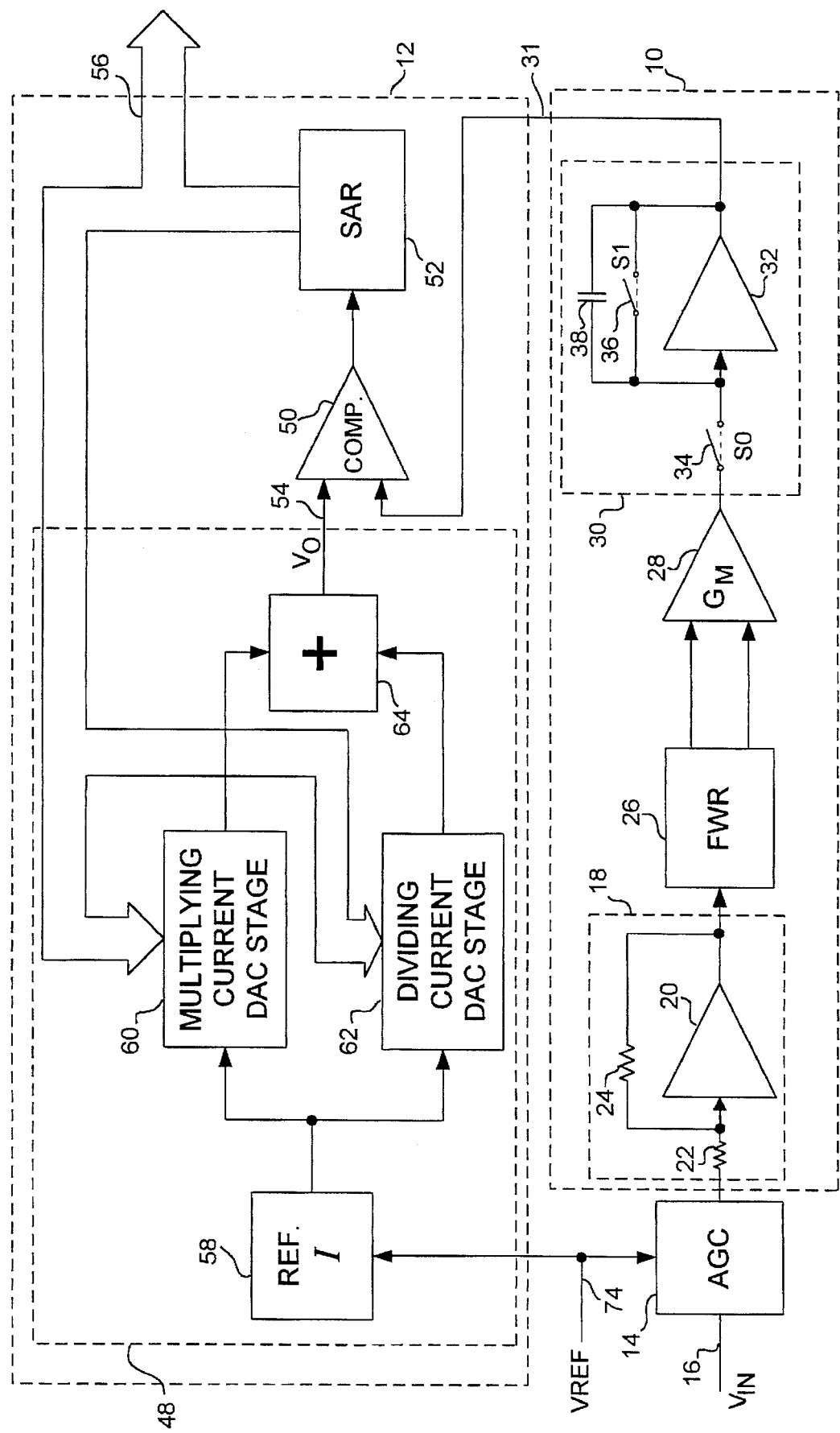
FIG. 1 is a block diagram representing a complementary metal-oxide-semiconductor (CMOS) chip having an area-integrating servo demodulator (AISD) and an analog-to-digital converter (ADC) of this invention.

As illustrated in FIG. 1, a complementary metal-oxide semiconductor (CMOS) integrated circuit or "chip" for a disk drive includes an area-integrating servo demodulator (AISD) 10, an analog-to-digital converter (ADC) 12, and an automatic gain controller (AGC) 14. The CMOS process by which such elements are formed on the chip is well-known in the art and therefore not described herein. For purposes of describing this invention, it is sufficient to understand that AISD 10, ADC 12 and AGC 14 are formed on a common substrate using the CMOS process.

AGC 14 receives a servo signal ($V_{IN}$) 16 from the disk drive head and preamplifier (not shown). AGC 14 receives servo signal 16 and applies a gain to maintain the output level within a predetermined range. AGC circuits are well-known in the art. Therefore, AGC 14 is not described in detail herein.

AISD 10 receives the gain-controlled output signal ($V_{OUT}$ in Equation 1 below) produced by AGC 14 and integrates it over a predetermined time period in accordance with the following formula:

$$V_{demodulated} = \int \frac{g_m}{C_0} V_{OUT} dt \qquad \text{Eqn. (1)}$$

Figure 2:
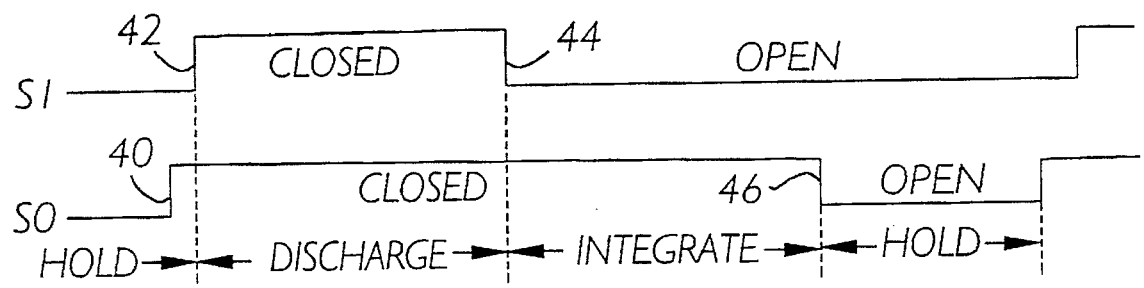
FIG. 2 is a timing diagram of the integrator portion of the AISD of FIG. 1.

AISD 10 includes an amplifier 18 having an op-amp 20 and two resisters 22 and 24. Op-amp 20 may be any suitable type. Amplifier 18 amplifies the gain-controlled output of AGC 14. AISD 10 also includes a full-wave rectifier 26 that receives the output of amplifier 18 and rectifies it. Full-wave rectifier 26 may be any suitable type. AISD 10 also includes a transconductance ($g_m$) amplifier 28 that converts the voltage output of full-wave rectifier 26 to a current. AISD 10 also includes an integrator 30 that integrates the current produced by transconductance amplifier 28. The output of integrator 30 is the demodulated servo signal 31 ($V_{demodulated}$ in Equation 1 above). Integrator 30 includes an op-amp 32, a first switch (S0) 34; a second switch (S1) 36 and a capacitor 38 ($C_0$ in Equation 1 above). Op-amp 34 may be of any suitable type. Switches 34 and 36 are relay-like switches that are controlled by the servo system timing circuitry (not shown). As illustrated in FIG. 2., switches 34 and 36 are both open, thereby placing integrator 30 in a "hold" state. In the "hold" state, the voltage at which capacitor 38 is charged is provided to the output of AISD 10 as demodulated servo signal 31. At transition 40 switch 34 closes and, shortly thereafter, at transition 42 switch 36 closes. Integrator 10 is in a "discharge" state when both switches 34 and 36 are closed because shorting capacitor 38 discharges it. At transition 44 switch 36 opens, thereby allowing capacitor 38 to charge. Charging capacitor 38 integrates the current received from transconductance amplifier 28. At transition 46 switch 34 opens, thereby returning integrator 30 to the "hold" state. Persons of skill in the art will readily be capable of designing suitable timing circuitry to control switches 34 and 36 in this manner.

ADC 12 includes a digital-to-analog converter (DAC) 48, a comparator 50 and a successive-approximation register (SAR) 52. Although the novel structure of DAC 48 is described in detail below, ADC 12 operates in a generally conventional manner. SAR 52 is a well-known circuit and is therefore not described in detail herein. As those of skill in the art will understand, SAR 52 produces successive estimates of the level of demodulated servo signal 31, beginning with an initial estimate that is one-half of the full-scale value. In the illustrated embodiment, ADC 12 is preferably 10 bits, yielding a full-scale value of 1023. DAC 48 converts the estimate provided by SAR 52 to an output voltage ($V_o$) 54. Comparator 50 compares output voltage 54 to demodulated servo signal 31. If the output of comparator 50 indicates that demodulated servo signal 31 is greater than output voltage 54, SAR 52 reduces its estimate. If the output of comparator 50 indicates that demodulated servo signal 31 is less than output voltage 54, SAR 52 increases its estimate. The digital ADC output 56 of SAR 52 reaches a stable value after ten successive estimates.

DAC 48 includes a current reference source 58, a multiplying current DAC stage 60, a dividing current DAC stage 62 and a summer 64. Multiplying current DAC stage 60 converts the five most significant bits of ADC output 56 to a current, and dividing current DAC stage 62 converts the five least significant bits of ADC output 56 to a current. Summer 64 adds these currents and produces output voltage 54, which represents their sum.

Figure 3:
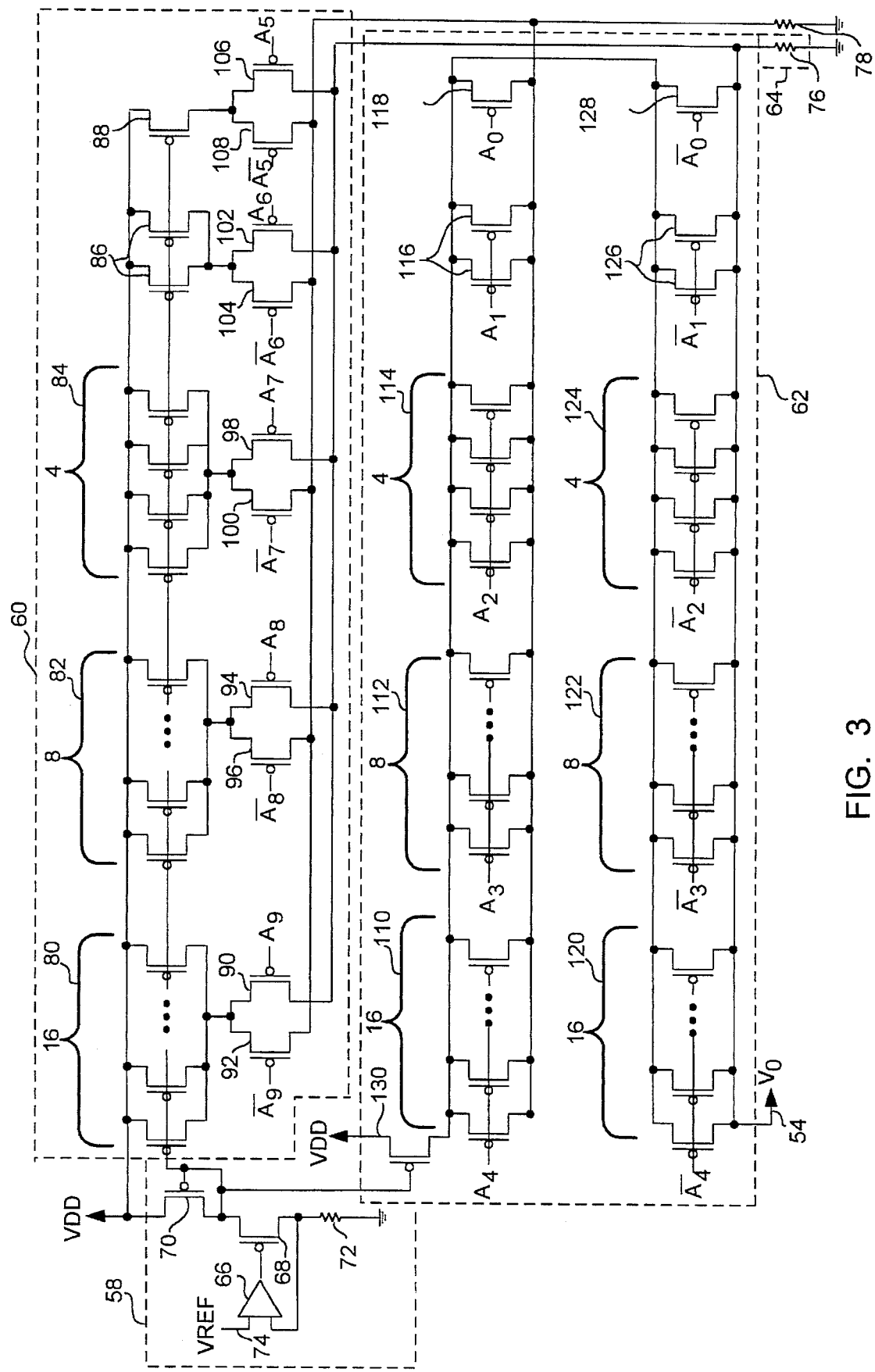
FIG. 3 is a schematic diagram of the two-stage digital-to-analog converter (DAC) portion of the ADC of FIG. 1.

DAC 48 is illustrated in further detail in FIG. 3. DAC 48 includes fewer transistors than a conventional 10-bit DAC and no precision resistors or capacitors, thereby allowing DAC 48 to be economically produced on a basic CMOS chip. All transistors are p-channel metal-oxide semiconductor (PMOS).

Current reference source 58 includes an op-amp 66, two transistors 68 and 70, and a resistor 72. Op-amp 66 receives a reference voltage 74, which is converted to a corresponding reference current. An important feature of the invention is that reference voltage 74 is also provided to AGC 14 (FIG. 1). Differential gain error is minimized because both DAC 48 and AGC 14 operate in response to the same reference voltage 74 and are on the same chip. The reference current is equal to 32/1023 of the full-scale current. In other words, the reference current is equal to 32 times the current that represents the least significant bit.

Summer 64 is a resistor 76. Another resistor 78 balances the currents, as described below.

Multiplying current DAC stage 60 includes five transistor groups, each corresponding to one of the five most significant bits of ADC output 56. A first transistor group has 16 transistors 80. A second transistor group has eight transistors 82. A third transistor group has four transistors 84. A fourth transistor group has two transistors 86. A fifth transistor group has one transistor 88. The gates of transistors 80, 82, 84, 86 and 88 are pulled up by a voltage provided by current source 58 such that transistors 80, 82, 84, 86 and 88 remain in an "on" state. The sources of transistors 80, 82, 84, 86 and 88 are connected to one another and to the supply voltage (VDD) of the chip. The drains of transistors 80, 82, 84, 86 and 88 are connected to one another. The drains of transistors 80 are also connected to the sources of two transistors 90 and 92 that control transistors 80. The sources of transistors 90 and 92 are connected together. The drain of transistor 90 is connected to resistor 76, and the drain of transistor 92 is connected to resistor 78. The gate of transistor 90 is connected to the most significant bit, bit 9 ($A_9$), of ADC output 56 (FIG. 1). The gate of transistor 92 is connected to the logical complement of bit 9. When bit 9 ($A_9$) is high or "1", transistor 90 is on, transistor 92 is off, and the current produced by transistors 80, which is 16 times the reference current, flows through transistor 90 to resistor 76. When bit 9 is low or "0", transistor 90 is off, transistor 92 is on, and the current produced by transistors 80 flows through transistor 92 to resistor 78.

Similarly, the drains of transistors 82 are also connected to the sources of two transistors 94 and 96 that control transistors 82. The sources of transistors 94 and 96 are connected together. The drain of transistor 94 is connected to resistor 76, and the drain of transistor 96 is connected to resistor 78. The gate of transistor 94 is connected to the next most significant bit, bit 8 ($A_8$), of ADC output 56 (FIG. 1). The gate of transistor 96 is connected to the logical complement of bit 8. When bit 8 is high, transistor 94 is on, transistor 96 is off, and the current produced by transistors 82, which is eight times the reference current, flows through transistor 94 to resistor 76. When bit 8 is low, transistor 94 is off, transistor 96 is on, and the current produced by transistors 82 flows through transistor 96 to resistor 78.

Similarly, the drains of transistors 84 are also connected to the sources of two transistors 98 and 100 that control transistors 84. The sources of transistors 98 and 100 are connected together. The drain of transistor 98 is connected to resistor 76, and the drain of transistor 100 is connected to resistor 78. The gate of transistor 98 is connected to the next most significant bit, bit 7 ($A_7$), of ADC output 56 (FIG. 1). The gate of transistor 100 is connected to the logical complement of bit 7. When bit 7 is high, transistor 98 is on, transistor 100 is off, and the current produced by transistors 84, which is four times the reference current, flows through transistor 98 to resistor 76. When bit 7 is low, transistor 98 is off, transistor 100 is on, and the current produced by transistors 80 flows through transistor 100 to resistor 78.

Similarly, the drains of transistors 86 are also connected to the sources of two transistors 102 and 104 that control transistors 86. The sources of transistors 102 and 104 are connected together. The drain of transistor 102 is connected to resistor 76, and the drain of transistor 104 is connected to resistor 78. The gate of transistor 102 is connected to the next most significant bit, bit 6 ($A_6$), of ADC output 56 (FIG. 1). The gate of transistor 104 is connected to the logical complement of bit 6. When bit 6 is high, transistor 102 is on, transistor 104 is off, and the current produced by transistors 86, which is twice the reference current, flows through transistor 102 to resistor 76. When bit 6 is low, transistor 102 is off, transistor 104 is on, and the current produced by transistors 86 flows through transistor 104 to resistor 78.

Similarly, the drain of transistor 88 is also connected to the sources of two transistors 106 and 108 that control transistor 88. The sources of transistors 106 and 108 are connected together. The drain of transistor 106 is connected to resistor 76, and the drain of transistor 108 is connected to resistor 78. The gate of transistor 106 is connected to the next most significant bit, bit 5 ($A_5$), of ADC output 56 (FIG. 1). The gate of transistor 108 is connected to the logical complement of bit 5. When bit 5 is high, transistor 106 is on, transistor 108 is off, and the current produced by transistor 88, which is equal to the reference current, flows through transistor 106 to resistor 76. When bit 5 is low, transistor 106 is off, transistor 108 is on, and the reference current flows through transistor 108 to resistor 78.

Each transistor group is controlled by the two transistors arranged in a differential configuration in order to improve switching speed. When the bit controlling the corresponding transistor group is high, current flows through resistor 76, which adds it to currents it receives from other transistor groups. When the bit controlling the corresponding transistor group is low, current flows through resistor 78. Maintaining a current flow through resistor 78 improves the speed at which the a transistor group can be switched. Although resistor 78 should have essentially the same value as resistor 76, resistrs 76 and 78 need not be precision, matched resistors.

Because the reference current is set to a predetermined value that is 32 times the current that represents the least significant bit of ADC output 56, the reference current represents the least significant bit (bit 5) of multiplying current DAC stage 60. Therefore, multiplying the reference current by the number of transistors 80, 82, 84, 86 and 88 that are turned on in response to the most significant five bits of ADC output 56 produces a total current that corresponds to the most significant five bits of ADC output 56.

Because the reference current is 32 times the least significant bit of ADC output 56, dividing current DAC stage 62 must divide the reference current down in response to the least significant five bits of ADC output 56 to obtain a current that corresponds to the least significant five bits of ADC output 56. Dividing current DAC stage 62 includes ten transistor groups, five of which correspond to the five least significant bits of ADC output 56, and five of which correspond to the complements of those bits. A first transistor group has 16 transistors 110. A second transistor group has eight transistors 112. A third transistor group has four transistors 114. A fourth transistor group has two transistors 116. A fifth transistor group has one transistor 118. A first complementary transistor group has 16 transistors 120. A second complementary transistor group has 8 transistors 122. A third complementary transistor group has four transistors 124. A fourth complementary transistor group has two transistors 126. A fifth complementary transistor group has one transistor 128. The sources of transistors 110, 112, 114, 116, 118, 120, 122, 124, 126 and 128 are connected to one another and to a transistor 130 that provides the reference current. The drains of transistors 110, 112, 114, 116 and 118 are connected to one another and to resistor 78. The drains of transistors 120, 122, 124, 126 and 128 are connected to one another and to resistor 76. The gates of transistors 110 are connected to bit 4 ($A_4$) of ADC output 56, and the gates of transistors 120 are connected to the complement of bit 4. The gates of transistors 112 are connected to bit 3 ($A_3$) of ADC output 56, and the gates of transistors 122 are connected to the complement of bit 3. The gates of transistors 114 are connected to bit 2 ($A_2$) of ADC output 56, and the gates of transistors 124 are connected to the complement of bit 2. The gates of transistors 116 are connected to bit 1 ($A_1$) of ADC output 56, and the gates of transistors 126 are connected to the complement of bit 1. The gate of transistor 118 is connected to the least significant bit, bit 0 ($A_0$), of ADC output 56, and the gate of transistor 128 is connected to the complement of bit 0.

The total current that dividing current DAC stage 62 contributes to resistor 76 is inversely proportional to the number of transistors 120, 122, 124 and 126 that are turned on. When the bit controlling the corresponding transistor group and complementary transistor group is high, the transistors 120, 122, 124, 126 and 128 that are turned on are, in effect, "active resistors" that control the current that reaches resistor 76. The transistors 120, 122, 124, 126 and 128 that are turned on contribute a resistance as though they were resistors connected in parallel with one another. Therefore, the total resistance is inversely proportional to the number of transistors 120, 122, 124, 126 and 128 that are turned on, and the current that dividing current DAC stage 62 contributes to resistor 76 is inversely proportional to this resistance. Transistors 110, 112, 114, 116 and 118 maintain a complementary current flow through resistor 78 to improve the speed at which the transistor groups can be switched.

The total current that resistor 76 receives from multiplying current DAC stage 60 and dividing current DAC stage 62 corresponds to the sum of the most significant five bits and least significant five bits of ADC output 56 (FIG. 1). Output voltage 54 across resistor 76 represents this sum.

This invention minimizes the number of transistors in the DAC, thereby minimizing the potential cumulative error. The 10-bit DAC 48 described above has 31 current sourcing transistors grouped into five groups in the multiplying stage and 62 current sourcing transistors grouped into ten groups in the dividing stage. Conventionally, a 10-bit DAC may have as many as 1023 such transistors, grouped into ten groups of 512 transistors, 256 transistors, 128 transistors, 64 transistors, 32 transistors, 16 transistors, eight transistors, four transistors, two transistors and one transistor, respectively.

Although the exemplary DAC 48 described above has 10 bits, persons of skill in the art will readily be capable of making a DAC having any number of bits in accordance with the teachings herein. The bits of such a DAC from least significant to most significant may be designated $A_0$ through $A_{M+N+1}$, where multiplying current DAC stage 60 has N bits, and dividing current DAC stage 62 has M bits. Multiplying current DAC stage 60 should thus have N groups of current sourcing transistors, each controlled by one of bits $A_n$ and its complement, where n is between M and M+N−1, inclusive. Dividing current DAC stage 62 should thus have M groups of current sourcing transistors, each controlled by one of bits $A_m$, and M groups of complementary current sourcing transistors, each controlled by the complement of one of bits $A_m$, where m is between zero and M−1, inclusive. The reference current should have a value of $2^M$.

Figure 4:
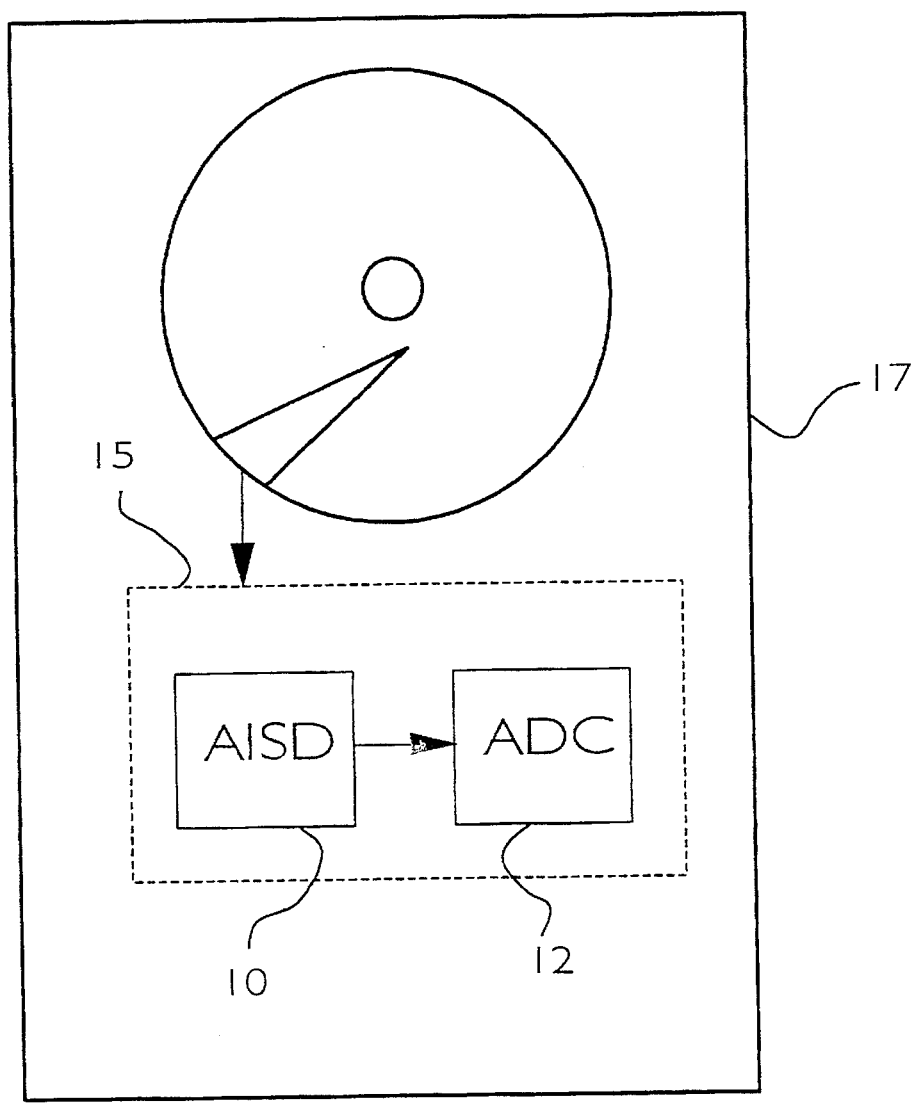
FIG. 4 is a schematic representation of a disk drive that incorporates the AISD and ADC of FIG. 1 embodied in a single CMOS chip.

FIG. 4 provides a schematic illustration of a disk drive 17 incorporating a CMOS chip 15 that includes AISD 10 and ADC 12 from FIG. 1. Disk drive 17 also incorporates other well-known elements (not shown) for storing and retrieving digital data.

Obviously, other embodiments and modifications of this invention will occur readily to those of ordinary skill in the art in view of these teachings. Therefore, this invention is to be limited only by the following claims, which include all such other embodiments and modifications when viewed in conjunction with the above specification and accompanying drawings.

We claim:

1. In a disk drive having an Area Integrating Servo Demodulator (AISD) for detecting head position information in a servo signal, an analog-to-digital converter (ADC) coupled to the AISD for converting an analog input signal to a digital output signal, the ADC comprising:

a reference current source for providing a reference current;

a first digital-to-analog converter (DAC) stage for receiving the reference current and a first portion of the digital output signal, for determining a multiple of the reference current in response to the first portion of the digital output signal, and for providing a first current in response to the multiple of the reference current;

a second digital-to-analog converter (DAC) stage for receiving the reference current and a second portion of the digital output signal, for determining a fraction of the reference current in response to the second portion of the digital output signal, and for providing a second current in response to the fraction of the reference current;

a summer for summing the first and second currents and providing a sum signal;

a comparator for comparing the sum signal with the analog input signal and providing a comparison signal; and a successive-approximation register for producing successive changes in the digital output signal in response to successive changes in the comparison signal.

2. The analog-to-digital converter recited in claim 1, wherein the second DAC stage has M bits, and the reference current has a value corresponding to $2^M$.

3. The analog-to-digital converter recited in claim 1, wherein:

the first DAC stage has N bits, each designated bit $A_n$ where n is an integer ranging between zero and N−1 inclusive, and wherein said first DAC stage includes N groups of first stage current sourcing transistors, the first stage current sourcing transistors in each group are coupled to bit $A_n$ and turned on in response to bit $A_n$ having a logical "1" state and turned off in response to bit $A_n$ having a logical "0" state, a group coupled to bit $A_n$ having $2^n$ first stage current sourcing transistors, and the first current is directly proportional to the total number of first stage current sourcing transistors turned on; and the second DAC stage has M bits, each designated bit $A_m$ where m is an integer ranging between zero and M−1 inclusive, and wherein said second DAC stage includes M groups of second stage complementary current sourcing transistors, the second stage complementary current sourcing transistors in each group are coupled to the logical complement of bit $A_m$ and turned on in response to the logical complement of bit $A_m$ having a logical "1" state and turned off in response to the logical complement of bit $A_m$ having a logical "0" state, a group coupled to the logical complement of bit $A_m$ has $2^m$ second stage complementary current sourcing transistors, and the second current is inversely proportional to the total number of second stage complementary current sourcing transistors turned on.

4. The analog-to-digital converter recited in claim 3, wherein said first DAC stage further comprises:

a plurality of first control transistors, wherein each is a p-channel metal-oxide semiconductor (PMOS) transistor having a source, a drain, and a gate, and wherein each first control transistor corresponds to one group of first stage current sourcing transistors, and the gate of the first control transistor that corresponds to the group of first stage current sourcing transistors coupled to bit $A_n$ is coupled to bit $A_n$; and a plurality of second control transistors, wherein each is a PMOS transistor having a source, a drain, and a gate, and wherein each second control transistor corresponds to one group of first stage current sourcing transistors, the gate of the second control transistor that corresponds to the group of first stage current sourcing transistors coupled to bit $A_n$ is coupled to the logical complement of bit $A_n$, and the source of the first control transistor is coupled to the source of the second control transistor;

wherein each first stage current sourcing transistor in each group is a PMOS transistor having a source, a drain, and a gate, the sources of the first stage current sourcing transistors are coupled to one another, and the drains of the first stage current sourcing transistors in each group are coupled to one another and to the sources of the corresponding first and second control transistors.

5. The analog-to-digital converter recited in claim 4, wherein:

each second stage complementary current sourcing transistor is a PMOS transistor having a source, a drain and a gate; and the sources of the second stage complementary current sourcing transistors are coupled to one another, the drains of the second stage complementary current sourcing transistors are coupled to one another, and the gates of the second stage complementary current sourcing transistors in each group are coupled to the logical complement of bit $A_m$.

6. The analog-to-digital converter recited in claim 5, wherein said second DAC stage further comprises:

M groups of second stage current sourcing transistors, wherein each second stage current sourcing transistor is a PMOS transistor having a source a drain and a gate; and wherein sources of the second stage current sourcing transistors are coupled to one another, the drains of the second stage current sourcing transistors are coupled to one another, and the gates of the second stage current sourcing transistors in each group are coupled to bit $A_m$ and turned on in unison in response to bit $A_m$ having a logical "1" state and turned off in unison in response to bit $A_m$ having a logical "0" state, and the group coupled to bit $A_m$ has $2^m$ second stage current sourcing transistors.

7. The analog-to-digital converter recited in claim 6, wherein the digital output signal has 10 bits, and N=5 and M=5.

8. A digital-to-analog converter (DAC), comprising:

a reference current source for providing a reference current;

a first DAC stage having N bits, each designated bit $A_n$ where n is an integer ranging between zero and N−1 inclusive, said first DAC stage including N groups of first stage current sourcing transistors, the first stage current sourcing transistors in each group coupled to bit $A_n$ and turned on in response to bit $A_n$ having a logical "1" state and turned off in response to bit $A_n$ having a logical "0" state, a group coupled to bit $A_n$ having $2^n$ first stage current sourcing transistors, and the first current being a multiple of the reference current and proportional to the total number of first stage current sourcing transistors turned on;

a second DAC stage having M bits, each designated bit $A_m$ where m is an integer ranging between zero and M−1 inclusive, said second DAC stage including M groups of second stage complementary current sourcing transistors, the second stage complementary current sourcing transistors in each group coupled to the logical complement of bit $A_m$ and turned on in response to the logical complement of bit $A_m$ having a logical "1" state and turned off in response to the logical complement of bit $A_m$ having a logical "0" state, a group coupled to the logical complement of bit $A_m$ having $2^m$ second stage complementary current sourcing transistors, and the second current being a fraction of the reference current and inversely proportional to the total number of second stage complementary current sourcing transistors turned on; and a summer for summing the first and second currents and providing a an analog output signal.

9. The DAC recited in claim 8, wherein said first DAC stage further comprises:

a plurality of first control transistors, wherein each is a p-channel metal-oxide semiconductor (PMOS) transistor having a source, a drain, and a gate, and wherein each first control transistor corresponds to one group of first stage current sourcing transistors, and the gate of the first control transistor that corresponds to the group of first stage current sourcing transistors coupled to bit $A_n$ is coupled to bit $A_n$; and a plurality of second control transistors, wherein each is a PMOS transistor having a source, a drain, and a gate, and wherein each second control transistor corresponds to one group of first stage current sourcing transistors, the gate of the second control transistor that corresponds to the group of first stage current sourcing transistors coupled to bit $A_n$ is coupled to the logical complement of bit $A_n$, and the source of the first control transistor is coupled to the source of the second control transistor;

wherein each first stage current sourcing transistor in each group is a PMOS transistor having a source, a drain, and a gate, the sources of the first stage current sourcing transistors are coupled to one another, and the drains of the first stage current sourcing transistors in each group are coupled to one another and to the sources of the corresponding first and second control transistors.

10. The DAC recited in claim 9, wherein:

each second stage complementary current sourcing transistor is a PMOS transistor having a source, a drain and a gate; and the sources of the second stage complementary current sourcing transistors are coupled to one another, the drains of the second stage complementary current sourcing transistors are coupled to one another, and the gates of the second stage complementary current sourcing transistors in each group are coupled to the logical complement of bit $A_m$.

11. The DAC recited in claim 10, wherein said second DAC stage further comprises:

M groups of second stage current sourcing transistors, wherein each second stage current sourcing transistor is a PMOS transistor having a source a drain and a gate; and wherein sources of the second stage current sourcing transistors are coupled to one another, the drains of the second stage current sourcing transistors are coupled to one another, and the gates of the second stage current sourcing transistors in each group are coupled to bit $A_m$ and turned on in response to bit $A_m$ having a logical "1" state and turned off in response to bit $A_m$ having a logical "0" state, and the group coupled to bit $A_m$ has $2^m$ second stage current sourcing transistors.

12. The DAC recited in claim 11, wherein the digital output signal has 10 bits, and N=5 and M=5.

13. A complementary metal-oxide semiconductor (CMOS) integrated circuit having a semiconducting substrate for receiving an analog input signal and providing a digital output signal, comprising:

a reference current source formed on the substrate for providing a reference current in response to a reference voltage;

a first digital-to-analog converter (DAC) stage formed on the substrate for receiving the reference current and a first portion of the digital output signal, for determining a multiple of the reference current in response to the first portion of the digital output signal, and for providing a first current in response to the multiple of the reference current;

a second digital-to-analog converter (DAC) stage formed on the substrate for receiving the reference current and a second portion of the digital output signal, for determining a fraction of the reference current in response to the second portion of the digital output signal, and for providing a second current in response to the fraction of the reference current;

a summer formed on the substrate for summing the first and second currents and providing a sum signal;

a comparator formed on the substrate for comparing the sum signal with the analog input signal and providing a comparison signal; and a successive-approximation register formed on the substrate for producing successive changes in the digital output signal in response to successive changes in the comparison signal.

14. The CMOS integrated circuit recited in claim 13, further comprising an automatic gain controller formed on the substrate for receiving a disk drive servo signal and the reference voltage and for providing a gain-controlled servo signal.

15. The CMOS integrated circuit recited in claim 13, further comprising an integrator formed on the substrate for providing an integration signal in response to a servo signal.

16. The CMOS integrated circuit recited in claim 15, further comprising:

an amplifier formed on the substrate for receiving the servo signal and producing an amplified signal;

a full-wave rectifier formed on the substrate for receiving the amplified signal and producing a rectified signal; and a transconductance cell formed on the substrate for receiving the rectified signal, producing a current signal and providing the current signal to said integrator.

17. The CMOS integrated circuit recited in claim 13, wherein:

the first DAC stage has N bits, each designated bit $A_n$ where n is an integer ranging between zero and N−1 inclusive, and wherein said first DAC stage includes N groups of first stage current sourcing transistors, the first stage current sourcing transistors in each group are coupled to bit $A_n$ and turned on in response to bit $A_n$ having a logical "1" state and turned off in response to bit $A_n$ having a logical "0" state, a group coupled to bit $A_n$ having $2^n$ first stage current sourcing transistors, and the first current is directly proportional to the total number of first stage current sourcing transistors turned on; and the second DAC stage has M bits, each designated bit $A_m$ where m is an integer ranging between zero and M−1 inclusive, and wherein said second DAC stage includes M groups of second stage complementary current sourcing transistors, the second stage complementary current sourcing transistors in each group are coupled to the logical complement of bit $A_m$ and turned on in response to the logical complement of bit $A_m$ having a logical "1" state and turned off in response to the logical complement of bit $A_m$ having a logical "0" state, a group coupled to the logical complement of bit $A_m$ has $2^m$ second stage complementary current sourcing transistors, and the second current is inversely proportional to the total number of second stage complementary current sourcing transistors turned on.

18. The CMOS integrated circuit recited in claim 17, wherein said first DAC stage further comprises:

a plurality of first control transistors, wherein each is a p-channel metal-oxide semiconductor (PMOS) transistor having a source, a drain, and a gate, and wherein each first control transistor corresponds to one group of first stage current sourcing transistors, and the gate of the first control transistor that corresponds to the group of first stage current sourcing transistors coupled to bit $A_n$ is coupled to bit $A_n$; and a plurality of second control transistors, wherein each is a PMOS transistor having a source, a drain, and a gate, and wherein each second control transistor corresponds to one group of first stage current sourcing transistors, the gate of the second control transistor that corresponds to the group of first stage current sourcing transistors coupled to bit $A_n$ is coupled to the logical complement of bit $A_n$, and the source of the first control transistor is coupled to the source of the second control transistor;

wherein each first stage current sourcing transistor in each group is a PMOS transistor having a source, a drain, and a gate, the sources of the first stage current sourcing transistors are coupled to one another, and the draining of the first stage current sourcing transistors in each group are coupled to one another and to the sources of the corresponding first and second control transistors.

19. The CMOS integrated circuit recited in claim 18, wherein:

each second stage complementary current sourcing transistor is a PMOS transistor having a source, a drain and a gate; and the sources of the second stage complementary current sourcing transistors are coupled to one another, the drains of the second stage complementary current sourcing transistors are coupled to one another, and the gates of the second stage complementary current sourcing transistors in each group are coupled to the logical complement of bit $A_m$.

20. The CMOS integrated circuit recited in claim 19, wherein said second DAC stage further comprises:

M groups of second stage current sourcing transistors, wherein each second stage current sourcing transistor is an PMOS transistor having a source a drain and a gate; and wherein sources of the second stage current sourcing transistors are coupled to one another, the drains of the second stage current sourcing transistors are coupled to one another, and the gates of the second stage current sourcing transistors in each group are coupled to bit $A_m$ and turned on in response to bit $A_m$ having a logical "1" state and turned off in response to bit $A_m$ having a logical "0" state, and the group coupled to bit $A_m$ has $2^m$ second stage current sourcing transistors.

21. The CMOS integrated circuit recited in claim 20, wherein the digital output signal has 10 bits, and N=5 and M=5.

22. A disk drive comprising:

an Area Integrating Servo Demodulator (AISD) for detecting head position information in a servo signal; and an analog-to-digital converter (ADC) coupled to the AISD for converting an analog input signal to a digital output signal, wherein the ADC includes a reference current source for providing a reference current, a first digital-to-analog converter (DAC) stage for receiving the reference current and a first potion of the digital output signal, for determining a multiple of the reference current in response to the first portion of the digital output signal, and for providing a first current in response to the multiple of the reference current, a second digital-to-analog converter (DAC) stage for receiving the reference current and a second portion of the digital output signal, for determining a fraction of the reference current in response to the second portion of the digital output signal, and for providing a second current in response to the fraction of the reference current, a summer for summing the first and second currents and providing a sum signal, a comparator for comparing the sum signal with the analog input signal and providing a comparison signal; and a successive-approximation register for producing successive changes in the digital output signal in response to successive changes in the comparison signal.

* * * * *